(12) United States Patent
Lin et al.

(10) Patent No.: US 10,566,952 B1
(45) Date of Patent: Feb. 18, 2020

(54) PHASE SHIFTER WITH BROADBAND AND PHASE ARRAY MODULE USING THE SAME

(71) Applicant: INDUSTRIAL TECHNOLOGY RESEARCH INSTITUTE, Hsinchu (TW)

(72) Inventors: Yen-Heng Lin, Tainan (TW); Zuo-Min Tsai, Miaoli (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/234,263

(22) Filed: Dec. 27, 2018

(51) Int. Cl.
*H03H 11/20* (2006.01)
*H01Q 3/34* (2006.01)

(52) U.S. Cl.
CPC .............. *H03H 11/20* (2013.01); *H01Q 3/34* (2013.01)

(58) Field of Classification Search
None
See application file for complete search history.

(56) References Cited

U.S. PATENT DOCUMENTS

| | | | |
|---|---|---|---|
| 5,701,107 A | 12/1997 | Kasahara et al. | |
| 7,123,116 B2* | 10/2006 | Hieda | H03H 11/18 333/164 |
| 7,239,218 B2 | 7/2007 | Nakamura | |
| 7,541,894 B2* | 6/2009 | Miyaguchi | H01P 1/185 333/139 |
| 7,495,529 B2 | 12/2009 | Miyaguchi et al. | |
| 8,212,632 B2 | 7/2012 | Miya | |
| 8,610,477 B2 | 12/2013 | Koechlin et al. | |
| 8,907,745 B2 | 12/2014 | Grondahl et al. | |
| 9,160,296 B2 | 10/2015 | Ehyaie | |
| 9,319,021 B2 | 4/2016 | Ehyaie et al. | |
| 9,628,075 B2 | 4/2017 | Cebi et al. | |

(Continued)

FOREIGN PATENT DOCUMENTS

| | | |
|---|---|---|
| CN | 1370338 A | 9/2002 |
| TW | 554564 | 9/2003 |
| TW | 200518454 A | 6/2005 |

OTHER PUBLICATIONS

Byeon et al., "A Low-Loss Compact 60-GHz Phase Shifter in 65-nm CMOS", IEEE Microwave and Wireless Components Letters, vol. 27, No. 7, Jul. 2017, pp. 663-665.

(Continued)

*Primary Examiner* — Jeffery S Zweizig
(74) *Attorney, Agent, or Firm* — Birch, Stewart, Kolasch & Birch, LLP

(57) ABSTRACT

A phase shifter with broadband and a phase array module using the same are provided. The phase shifter includes at least one phase shifting unit. The phase shifting unit includes a first switch, a first capacitor, a second capacitor, a first inductor, a second switch, a second inductor, a first resistor and a second resistor. The first capacitor is connected between the first inductor and a second end of the first switch. The second capacitor is connected between the first inductor and a third end of the first switch. A second end of the second switch is connected to a ground end. The two ends of the second inductor are respectively connected to a ground end and a third end of the second switch. The first inductor is connected between the first capacitor and the third end of the second switch.

10 Claims, 13 Drawing Sheets

211'

(56) References Cited

U.S. PATENT DOCUMENTS

| | | |
|---|---|---|
| 10,033,349 B2 | 7/2018 | Gamal El Din et al. |
| 2007/0188264 A1 | 8/2007 | Miyaguchi et al. |

OTHER PUBLICATIONS

Kang et al., "Single and Four-Element Ka-Band Transmit/Receive Phased-Array Silicon RFICs With 5-bit Amplitude and Phase Control", IEEE Transactions on Microwave Theory and Techniques, vol. 57, No. 12, Dec. 2009, pp. 3534-3543.

Lee et al., "W-Band CMOS 4-Bit Phase Shifter for High Power and Phase Compression Points", IEEE Transactions on Circuits and Systems—II: Express Briefs, vol. 62, No. 1, Jan. 2015, pp. 1-5.

Li et al., "60-GHz 5-bit Phase Shifter With Integrated VGA Phase-Error Compensation", IEEE Transactions on Microwave Theory and Techniques, vol. 61, No. 3, Mar. 2013, pp. 1224-1235.

Meng et al., "A 57-to-64-GHz 0.094-mm2 5-bit Passive Phase Shifter in 65-nm CMOS", IEEE Transactions on Very Large Scale Integration (VLSI) Systems, vol. 24, No. 5, May 2016, pp. 1917-1925.

Min et al., "Single-Ended and Differential Ka-Band BiCMOS Phased Array Front-Ends", IEEE Journal of Solid-State Circuits, vol. 43, No. 10, Oct. 2008, pp. 2239-2250.

Shin et al., "Low Insertion Loss, Compact 4-bit Phase Shifter in 65 nm CMOS for 5G Applications", IEEE Microwave and Wireless Components Letters, vol. 26, No. 1, Jan. 2016, pp. 37-39.

Yang et al., "Ka-Band 5-Bit MMIC Phase Shifter Using InGaAs PIN Switching Diodes", IEEE Microwave and Wireless Components Letters, vol. 21, No. 3, Mar. 2011, pp. 151-153.

Zheng et al., "Design and Performance of a Wideband Ka-Band 5-b MMIC Phase Shifter", IEEE Microwave and Wireless Components Letters, vol. 27, No. 5, May 2017, pp. 482-484.

\* cited by examiner

PHASE SHIFTER WITH BROADBAND AND PHASE ARRAY MODULE USING THE SAME

TECHNICAL FIELD

The disclosure relates in general to a phase shifter and a phase array module using the same.

BACKGROUND

Along with the development of communication technology, various antenna modules have been invented. The phase array module in the antenna module includes a plurality of phase shifters. The frequencies applicable to 5G communication are, for example, 28 GHz and 39 GHz. The phase shifter must be wide enough to allow the antenna module to be applied to both frequencies simultaneously.

To achieve a wide frequency band, it is necessary to maintain low RMS phase error and low RMS gain error throughout the frequency band. The RMS phase error is the average of the phase error of the phase shifter. The RMS gain error is the average of the insertion loss variation of the phase shifter. For example, the RMS phase error may be calculated according to the following equation (1), and the RMS gain error may be calculated according to the following equation (2).

RMS phase error=

$$\text{RMS phase error} = \sqrt{\frac{1}{N-1} \sum_{i=2}^{N} |\theta_{\Delta i}|^2} \quad (1)$$

RMS gain error=

$$\text{RMS gain error} = \sqrt{\frac{1}{N-1} \sum_{i=2}^{N} |A_i - A_{Avg}|^2} \quad (2)$$

N is the number of states, i is the i-th state, $\theta_{\Delta i}$ is the error between the i-th state and the ideal state, $A_i$ is the insertion loss of the i-th state, and $A_{Avg}$ is the average of the insertion loss of all states.

A traditional 5 bits switching type phase shifter includes 5 phase shifting units with different angles. Through the switching of the ON state/OFF state of each phase shifting unit, 32 different phase states can be formed.

However, in the traditional phase shifter, it is quite difficult to maintain a low enough RMS phase error and a low enough RMS gain error throughout the frequency band.

Therefore, how to design a phase shifter that can be applied to broadband has become the main research direction of future development.

SUMMARY

The disclosure is directed to a phase shifter with broadband and a phase array module using the same.

According to one embodiment, a phase shifter is provided. The phase shifter includes at least one phase shifting unit. The phase shifting unit includes a first switch, a first capacitor, a second capacitor, a first inductor, a second switch, a second inductor, a first resistor and a second resistor. The first switch has a first end, a second end and a third end. The first capacitor is connected between the first inductor and the second end of the first switch. The second capacitor is connected between the first inductor and the third end of the first switch. The second switch has a first end, a second end and a third end. The second end of the second switch is connected to a ground end. Two ends of the second inductor are respectively connected to a ground end and the third end of the second switch. The first inductor is connected between the first capacitor and the third end of the second switch. The first resistor is connected between the first end of the first switch and a first control voltage. The second resistor is connected between the first end of the second switch and a second control voltage. The first control voltage is a reverse voltage of the second control voltage.

According to another embodiment, a phase array module is provided. The phase array module includes a power divider, an adjustable attenuator array, a phase array, a first switch array, a power amplifier array, a low noise amplifier array and a second switch array. The adjustable attenuator array is connected to the power divider. The phase array is connected to the adjustable attenuator array. The phase array includes a plurality of phase shifters. One of the phase shifters includes at least one phase shifting unit. The phase shifting unit includes a first switch, a first capacitor, a first capacitor, a first inductor, a second switch and a second inductor. The first switch has a first end, a second end and a third end. The first capacitor is connected between the first inductor and the second end of the first switch. The second capacitor is connected between the first inductor and the third end of the first switch. The second switch has a first end, a second end and a third end. The second end of the second switch is connected to a ground end. Two ends of the second inductor are respectively connected to a ground end and the third end of the second switch. The first inductor is connected between the first capacitor and the third end of the second switch. The first resistor is connected between the first end of the first switch and a first control voltage. The second resistor is connected between the first end of the second switch and a second control voltage. The first control voltage is a reverse voltage of the second control voltage. The first switch array is connected to the phase array. The power amplifier array is connected to the first switch array. The low noise amplifier array is connected to the first switch array. The second switch array is connected to the power amplifier array and the low noise amplifier array.

Figure 1:
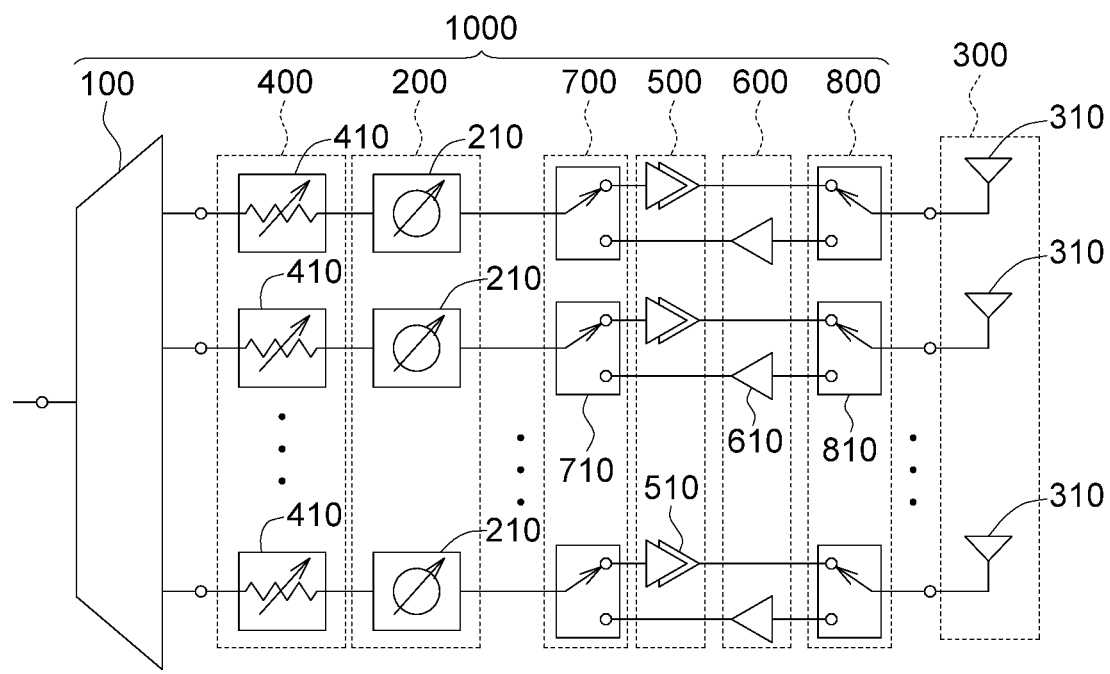
FIG. 1 shows a phase array module according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows a phase array module 1000 according to one embodiment. The phase array module 1000 at least includes a power divider 100, an adjustable attenuator array 400, a phase array 200, a first switch array 700, a power amplifier (PA) array 500, a low noise amplifier (LNA) array 600 and a second switch array 800.

The adjustable attenuator array 400 is connected to the power divider 100. The adjustable attenuator array 400 includes a plurality of adjustable attenuators 410. The phase array 200 is connected to the adjustable attenuator array 400. For example, the phase array 200 includes a plurality of phase shifters 210. The power divider 100 has a plurality of output terminals. Each of the adjustable attenuators 410 and each of the phase shifters 210 are connected to one of the output terminals of the power divider 100. The first switch array 700 is connected to the phase array 200. The first switch array 700 includes a plurality of first switches 710. Each of the first switches 710 is connected to one of the phase shifters 210. The power amplifier array 500 is connected to the first switch array 700. The low noise amplifier array 600 is connected to the first switch array 700. The power amplifier array 500 includes a plurality of power amplifier 510. The low noise amplifier array 600 includes a plurality of low noise amplifiers 610. Each of the power amplifiers 510 and each of the low noise amplifiers 610 are connected to one of the first switches 710. The second switch array 800 is connected to the power amplifier array 500 and the low noise amplifier array 600. The second switch array 800 includes a plurality of second switches 810. Each of the second switches 810 is connected to one of the power amplifiers 510 and one of the low noise amplifiers 610. The antenna array 300 is connected to the second switch array 800. The antenna array 300 includes a plurality of antennas 310. Each of the antennas 310 is connected to one of the second switches 810.

Figure 2:
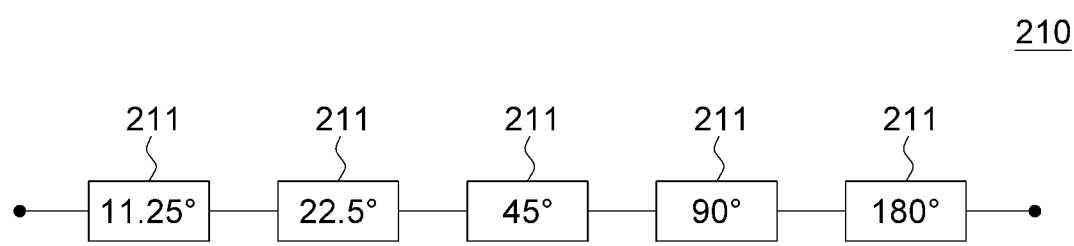
FIG. 2 shows a phase shifter according to one embodiment.

Please refer to FIG. 2, which shows the phase shifter 210 according to one embodiment. For example, the phase shifter 210 includes a plurality of phase shifting units 211. The phase shifting angles of the phase shifting units 211 may be different, for example, 11.25 degrees, 22.5 degrees, 45 degrees, 90 degrees, 180 degrees. Each of the phase shifting units 211 can be turned on or turned off to form various phase shift angles. In order to increase the frequency band to which the phase shifter 210 can be applied, the relative phase error and the insertion loss variation between the ON state and OFF state of each phase shifting unit 211 within the frequency band become important.

Figure 3:
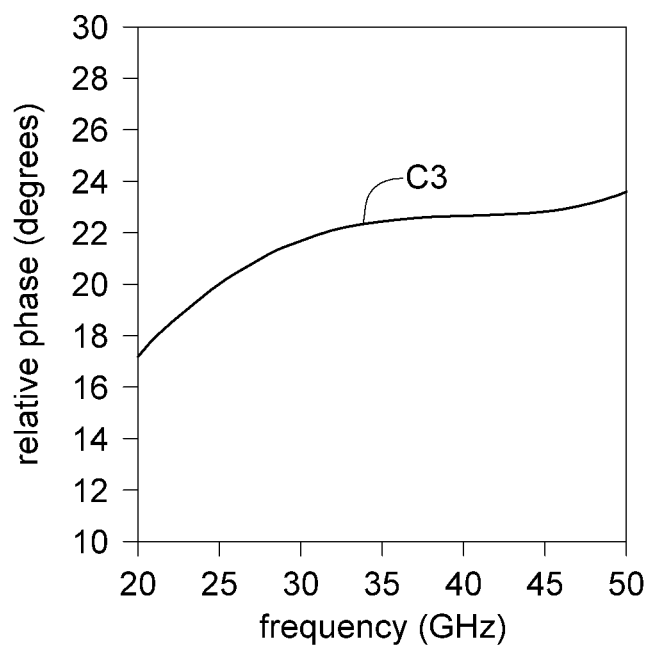
FIG. 3 shows an example of a relative phase curve of a phase shifting unit with 22.5 degrees.

As shown in FIG. 3, an example of a relative phase curve C3 of the phase shifting unit 211 with 22.5 degrees is shown. The relative phase is the change of phase degree of the phase shift unit 211 at the ON state relative to the OFF state corresponding to different frequencies. The lower the relative phase error of the phase shifting unit 211 can be controlled (the more gradual the relative phase curve C3 is), the smaller the RMS phase error of the phase shifter 210 will be.

Figure 4:
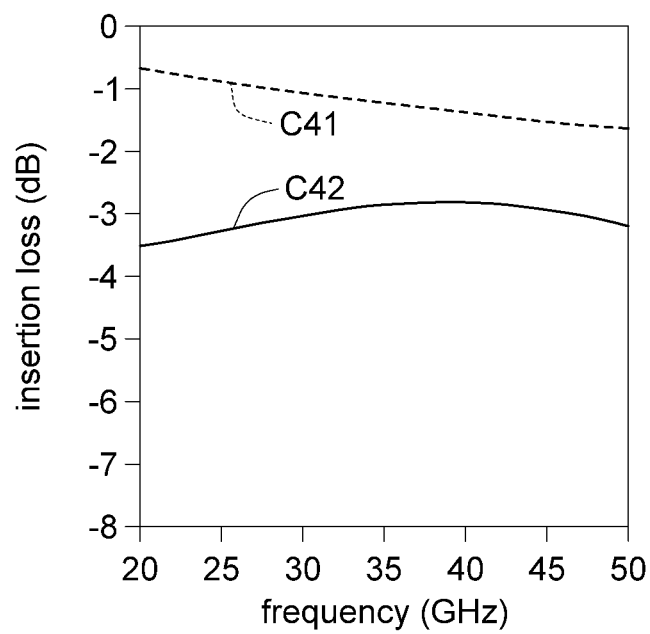
FIG. 4 shows an example of an ON state insertion loss curve and an OFF state insertion loss curve of the phase shifting unit with 22.5 degrees.

As shown in FIG. 4, an example of an ON state insertion loss curve C41 and an OFF state insertion loss curve C42 of the phase shifting unit 211 with 22.5 degrees is shown. The insertion loss variation is the difference between the insertion loss curve C41 and the insertion loss curve C42. The smaller the insertion loss variation of the phase shift unit 211 can be controlled, the smaller the RMS gain error of the phase shifter 210 will be.

The present disclosure is directed to the design of the phase shifting unit 211 to achieve the goal of maintaining a lower relative phase error and a lower insertion loss variation over a larger bandwidth, thereby a low enough RMS phase error and a low enough RMS gain error are maintained throughout the frequency band for allowing the phase shifter 210 to be applied to broadband.

Figure 5:
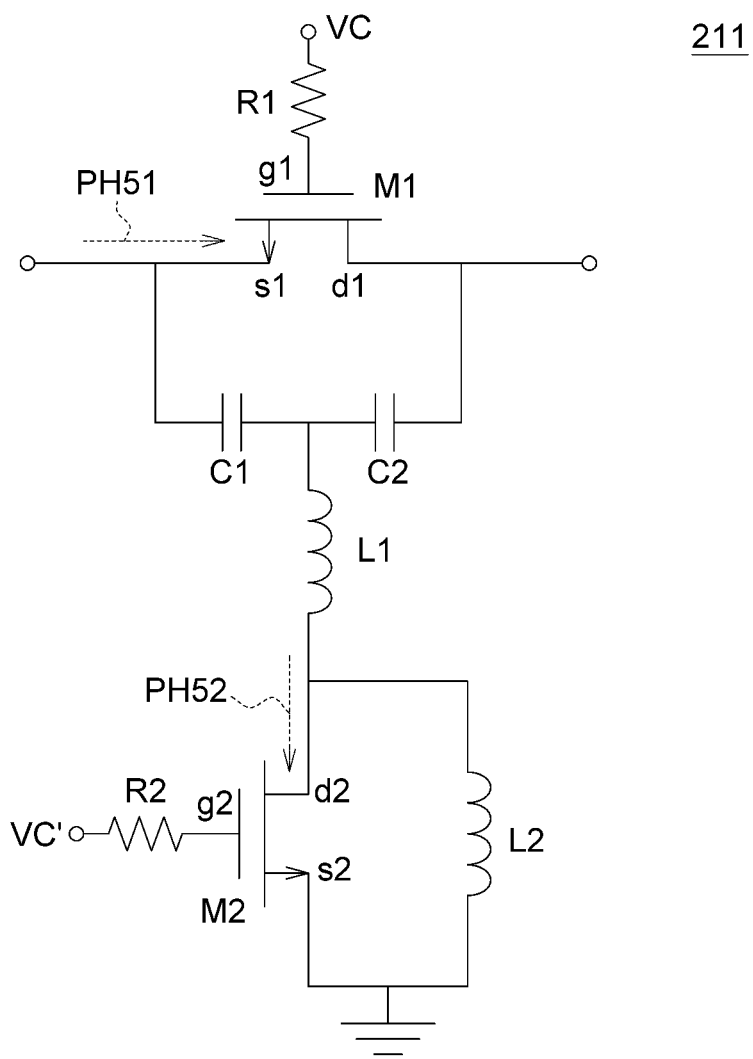
FIG. 5 shows the phase shifting unit according to one embodiment.

Please refer to FIG. 5, which shows the phase shifting unit 211 according to one embodiment. The phase shift unit 211 is, for example, a switched millimeter wave phase shifting architecture. The phase shifting unit 211 includes a first switch M1, a first capacitor C1, a second capacitor C2, a second switch M2, a first inductor L1, a second inductor L2, a first resistor R1 and a second resistor R2. The first switch M1 has a first end g1, a second end s1 and a third end d1.

The first switch M1 is, for example, a N type Metal-Oxide-Semiconductor field-effect transistor (NMOS). The first end g1, the second end s1 and the third end d1 are, for example, a gate, a source and a drain.

The first capacitor C1 is connected to the first inductor L1 and the second end s1 of the first switch M1. The second capacitor C2 is connected to the first inductor L1 and the third end d1 of the first switch M1.

The second switch M2 has a first end g2, a second end s2 and a third end d2. The second switch M2 is, for example, a N type Metal-Oxide-Semiconductor field-effect transistor (NMOS). The first end g2, the second end s2 and the third end d2 are, for example, a gate, a source and a drain. The second end s2 is connected to a ground end.

Two ends of the second inductor L2 are connected to a ground end and the third end d2 of the second switch M2. The first inductor L1 is connected between the first capacitor C1 (or the second capacitor C2) and the third end d2 of the second switch M2.

As shown in FIG. 5, the first resistor R1 is connected between the first end g1 of the first switch M1 and a first control voltage VC. The second resistor R2 is connected between the first end g2 of the second switch M2 and a second control voltage VC'. The first control voltage VC is a reverse voltage of the second control voltage VC'. That is to say, when the first control voltage VC is at a low voltage level (below the threshold voltage of the first switch M1), the second control voltage VC' is at a high voltage level (higher than the threshold voltage of the second switch M2). When the first control voltage VC is at a high voltage level (higher than the threshold voltage of the first switch M1), the second control voltage VC' is at a low voltage level (below the threshold voltage of the second switch M2).

Figure 6:
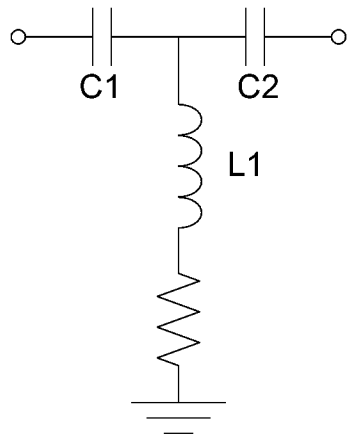
FIG. 6 shows an equivalent circuit diagram of the phase shifting unit at which the first control voltage is at the low voltage level and the second control voltage is at the high voltage level.
Figure 7:
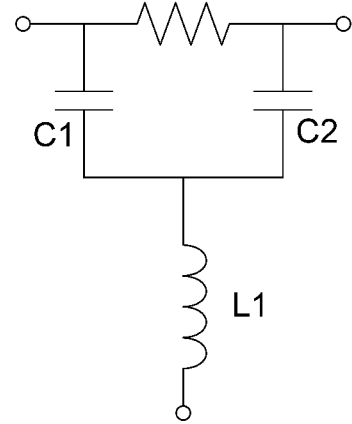
FIG. 7 shows an equivalent circuit diagram of the phase shifting unit in which the first control voltage is at the high voltage level and the second control voltage is at the low voltage level.

Two different phase states can be achieved by controlling the first control voltage VC and the second control voltage VC'. Please referring to FIGS. 5 to 7, FIG. 6 shows an equivalent circuit diagram of the phase shifting unit 211 at which the first control voltage VC is at the low voltage level and the second control voltage VC' is at the high voltage level, and FIG. 7 shows an equivalent circuit diagram of the phase shifting unit 211 in which the first control voltage VC is at the high voltage level and the second control voltage VC' is at the low voltage level. As shown in FIGS. 5 and 6, when the first control voltage VC is at the low voltage level, the first switch M1 is not turned on. When the second control voltage VC' is at the high voltage level, the second switch M2 is turned on, so that a current path PH52 is formed. An open circuit is formed between the second end s1 and the third end d1 of the first switch M1, and the second switch M2 is equivalent to a small resistor to form the open state (high pass T type circuit) of FIG. 6.

As shown in FIGS. 5 and 7, when the first control voltage VC is at the high voltage level, the first switch M1 is turned on, so that a current path PH51 is formed, and the first switch M1 is equivalent to a small resistance. When the second control voltage VC' is at the low voltage level, the second switch M2 is equivalent to a capacitor, and the capacitor resonates with the second inductor L2 and is regarded as an open circuit at the target frequency. A path is formed between the second end s1 and the third end d1 of the first switch M1, and an open circuit is formed between the second end s2 and the third end d2 of the second switch M2 to form the OFF state of FIG. 7.

Figure 8:
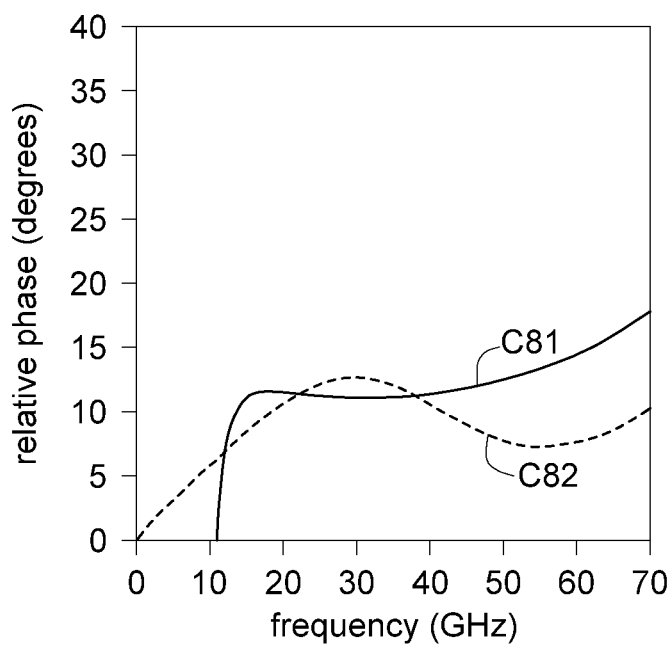
FIG. 8 shows an example of a relative phase curve of the phase shifting unit with 11.25 degrees of FIG. 5 and a relative phase curve of a traditional phase shifting unit with 11.25 degrees.

Please refer to FIG. 8, which shows an example of a relative phase curve C81 of the phase shifting unit 211 with 11.25 degrees of FIG. 5 and a relative phase curve C82 of the traditional phase shifting unit with 11.25 degrees. As shown in FIG. 8, the relative phase curve C81 is more gradual, and has lower relative phase error.

Figure 9A:
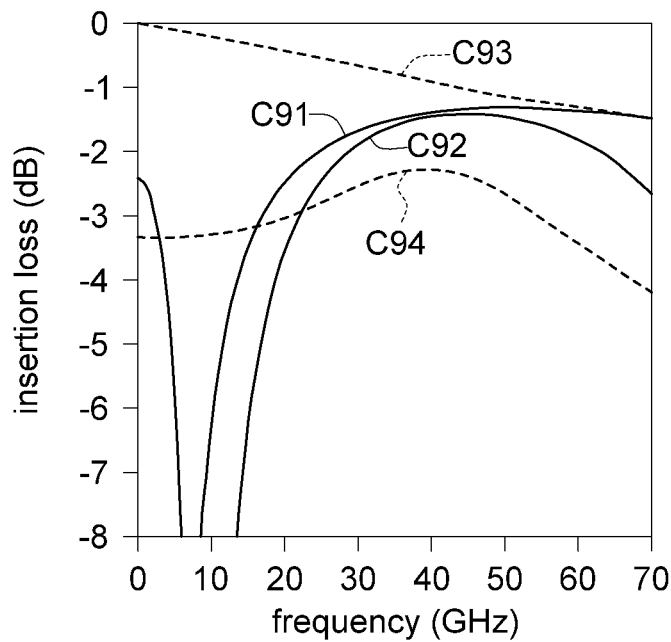
FIG. 9A shows an example of insertion loss curves of the phase shifting unit with 11.25 degrees of FIG. 5 and insertion loss curves of the traditional phase shifting unit with 11.25 degrees.
Figure 9B:
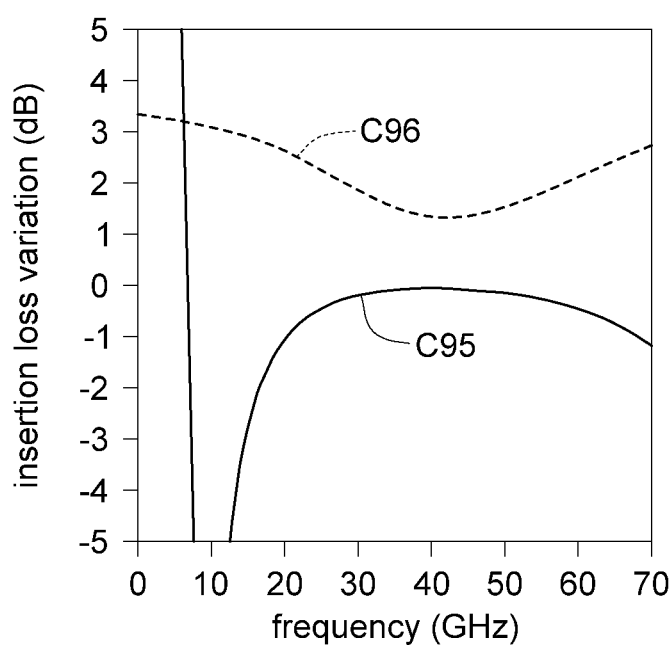
FIG. 9B shows an insertion loss variation curve of the phase shifting unit with 11.25 degrees of FIG. 5 and an insertion loss variation curve of the traditional phase shifting unit with 11.25 degrees.

Please referring to FIGS. 9A and 9B, FIG. 9A shows an example of insertion loss curves C91, C92 of the phase shifting unit 211 with 11.25 degrees of FIG. 5 and insertion loss curves C93, C94 of the traditional phase shifting unit with 11.25 degrees, and FIG. 9B shows an insertion loss variation curve C95 of the phase shifting unit 211 with 11.25 degrees of FIG. 5 and an insertion loss variation curve C96 of the traditional phase shifting unit with 11.25 degrees. The insertion loss curve C91 and the insertion loss curve C93 are measured at the ON state. The insertion loss curve C92 and the insertion loss curve C94 are measured at the OFF state. The difference between the insertion loss curve C91 and the insertion loss curve C92 is the insertion loss variation curve C95; the difference between the insertion loss curve C93 and the insertion loss curve C94 is the insertion loss variation curve C96. As shown in FIG. 9B, the insertion loss variation curve C95 is close to 0 over a wide frequency range, so the insertion loss variation is very low.

Figure 10:
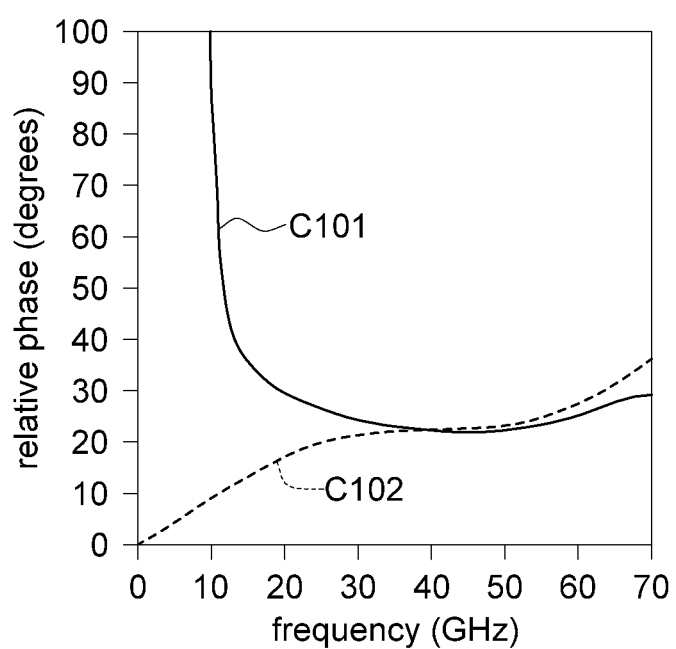
FIG. 10 shows an example of a relative phase curve of the phase shifting unit with 22.5 degrees of FIG. 5 and a relative phase curve of the traditional phase shifting unit with 22.5 degrees.

Please refer to FIG. 10, which shows an example of a relative phase curve C101 of the phase shifting unit 211 with 22.5 degrees of FIG. 5 and a relative phase curve C102 of the traditional phase shifting unit with 22.5 degrees. As shown in FIG. 10, the relative phase curve C101 is more gradual, and has lower relative phase error.

Figure 11A:
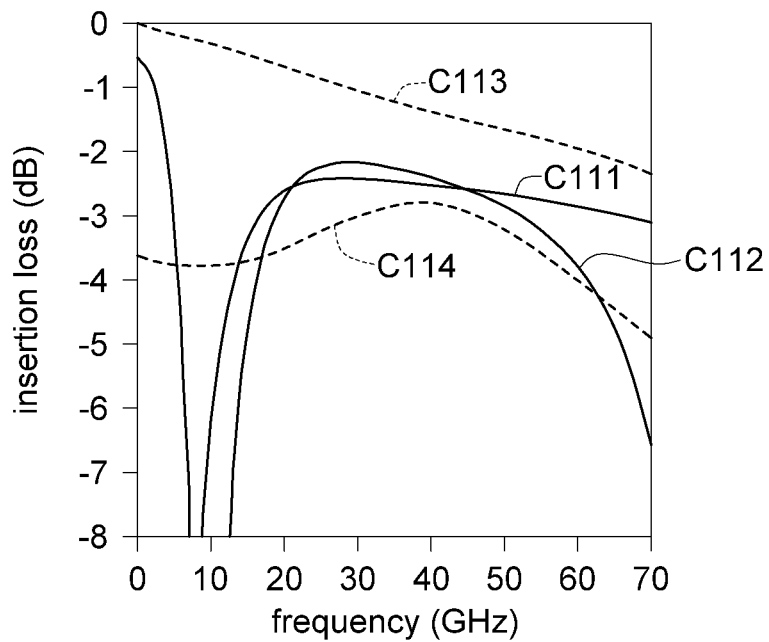
FIG. 11A shows an example of insertion loss curves of the phase shifting unit with 22.5 degrees of FIG. 5 and insertion loss curves of the traditional phase shifter with 22.5 degrees.
Figure 11B:
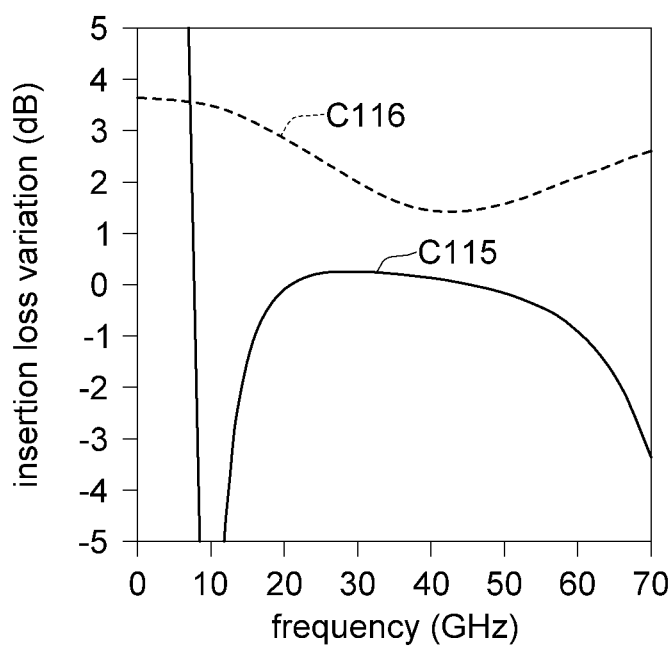
FIG. 11B shows an example of an insertion loss variation curve of the phase shifter with 22.5 degrees of FIG. 5 and an insertion loss variation curve of the traditional phase shifter with 22.5 degrees.

Please referring to FIGS. 11A and 11B, FIG. 11A shows an example of insertion loss curves C111, C112 of the phase shifting unit 211 with 22.5 degrees of FIG. 5 and insertion loss curves C113, C114 of the traditional phase shifter with 22.5 degrees, and FIG. 11B shows an example of an insertion loss variation curve C115 of the phase shifter 210 with 22.5 degrees of FIG. 5 and an insertion loss variation curve C116 of the traditional phase shifter with 22.5 degrees. The insertion loss curve C111 and the insertion loss curve C113 are measured at the ON state. The insertion loss curve C112 and the insertion loss curve C114 are measured at the OFF state. The difference between the insertion loss curve C111 and the insertion loss curve C112 is the insertion loss variation curve C115; the difference between the insertion loss curve C113 and the insertion loss curve C114 is the insertion loss variation curve C116. As shown in FIG. 11B, the insertion loss variation curve C115 is close to 0 over a wide frequency range, so the insertion loss variation is very low.

Figure 12:
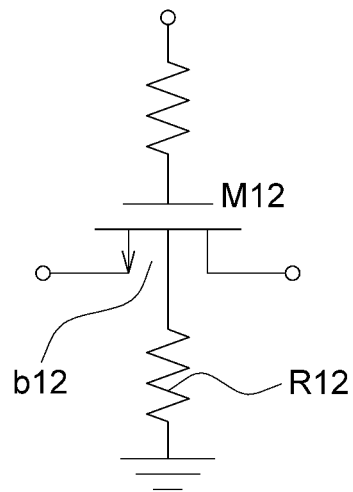
FIG. 12 shows a transistor whose body is connected to a resistor.
Figure 13:
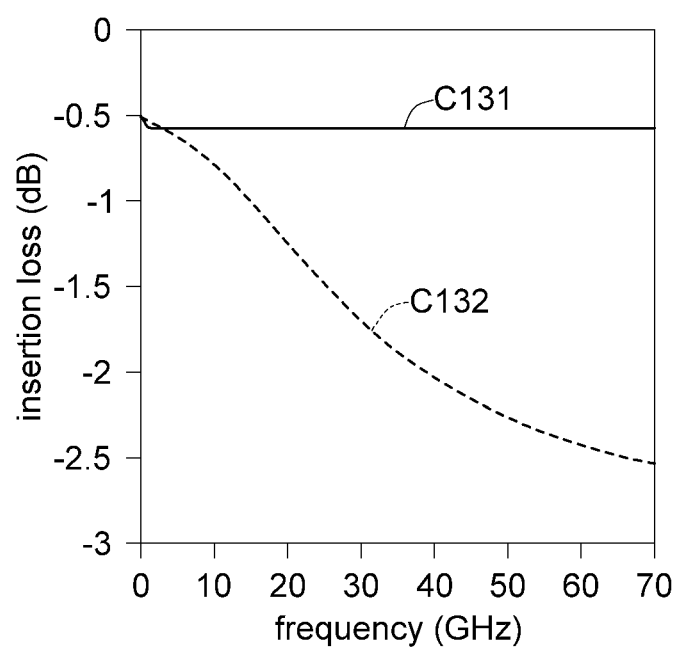
FIG. 13 shows an example of an insertion loss (versus frequency) curve of the transistor of FIG. 12 and an insertion loss (versus frequency) curve of the traditional transistor.

Please refer to FIG. 12, which shows a transistor M12 whose body b12 is connected to a resistor R12. One end of the resistor R12 is connected to a ground end. In tradition, the body of the traditional transistor is directly grounded, the parasitic capacitance at the body affects the impedance of the transistor, which in turn affects the insertion loss of the high frequency signal through the transistor. As shown in FIG. 12, the resistor R12 is connected to body b12 of the transistor M12. For high frequency signals, the resistor R12 provides an open circuit that reduces the parasitic capacitance effect of the body b12, thereby reducing the insertion loss; hereinafter "body floating technology." Please refer to FIG. 13, which shows an example of an insertion loss (versus frequency) curve C131 of the transistor M12 of FIG. 12 and an insertion loss (versus frequency) curve C132 of the traditional transistor. The body of the traditional transistor is directly grounded. As shown in FIG. 13, it can be found that the body floating technology can make the transistor M12 have lower insertion loss, especially at the high frequency.

Figure 14:
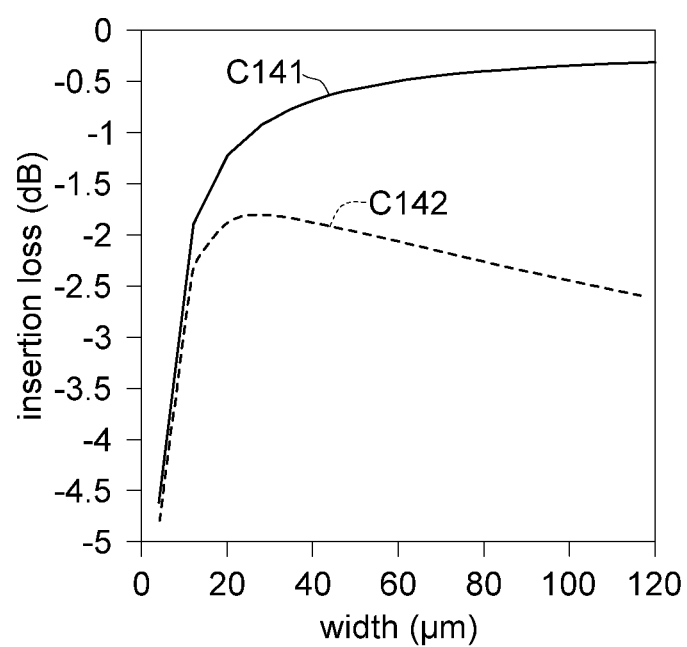
FIG. 14 shows an example of an insertion loss (versus width) curve of the transistor performed at 39 GHz and an insertion loss (versus width) curve of the traditional transistor performed at 39 GHz.

Please refer to FIG. 14, which shows an example of an insertion loss (versus width) curve C141 of the transistor M12 performed at 39 GHz and an insertion loss (versus width) curve C142 of the traditional transistor performed at 39 GHz. As shown in FIG. 14, the larger the width of the transistor is, the better the reduction of the parasitic capacitance effect will be.

Figure 15:
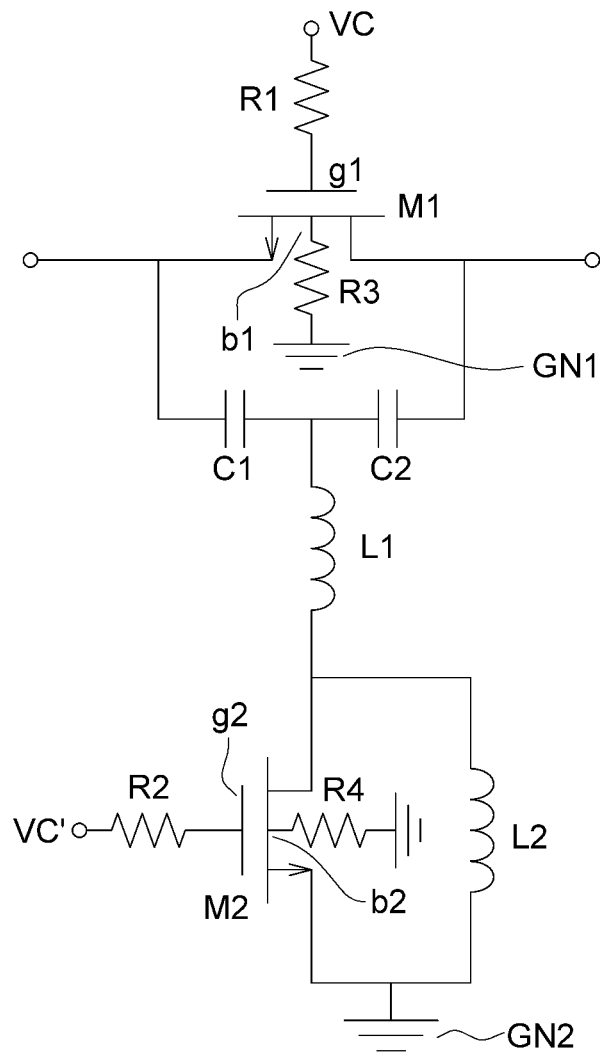
FIG. 15 shows a phase shifting unit using the design of FIG. 12.

Please refer to FIG. 15, which shows a phase shifting unit 211' using the design of FIG. 12. The first switch M1 further has a fourth end b1, and the second switch M2 further has a fourth end b2. The fourth end b1 of the first switch M1 is a body, and the fourth end b2 of the second switch M2 is a body. The phase shifting unit 211' of FIG. 15 is different from the phase shifting unit 211 of FIG. 5 in that the phase shifting unit 211' further includes a resistor R3 and a fourth resistor R4. The third resistor R3 is connected between the fourth end b1 of the first switch M1 and a ground end GN1, and the fourth resistor R4 is connected between the fourth end b2 of the second switch M2 and a ground end GN2.

Figure 16:
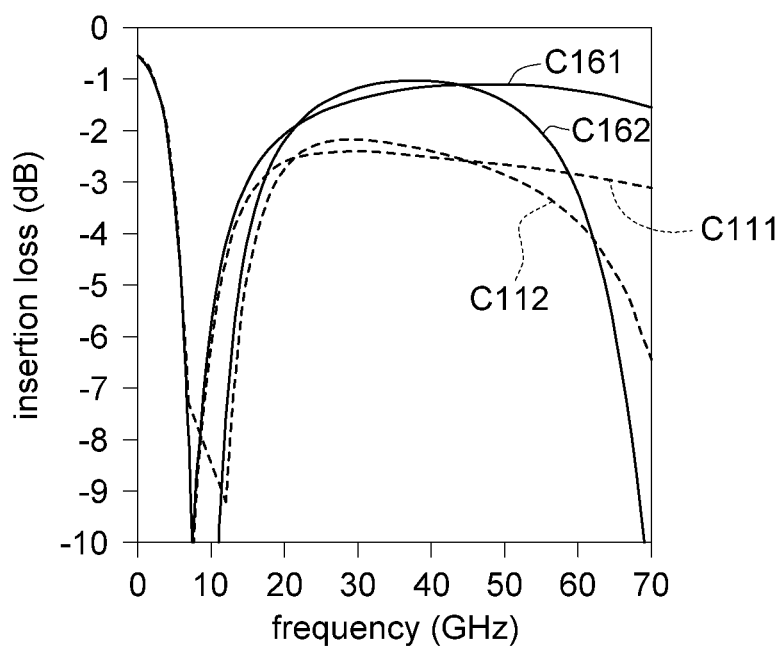
FIG. 16 shows an example of insertion loss curves of the phase shifting unit with 22.5 degrees of FIG. 5 and insertion loss curves of the phase shifting unit with 22.5 degrees of FIG. 15.

Please refer FIG. 16, which shows an example of insertion loss curves C111, C112 of the phase shifting unit 211 with 22.5 degrees of FIG. 5 and insertion loss curves C161, C162 of the phase shifting unit 211' with 22.5 degrees of FIG. 15. As shown in FIG. 16, the insertion loss of the phase shifting unit 211' with 22.5 degrees is reduced by 1 dB, so it is proved that the body floating technology can to effectively reduce the parasitic capacitance effect. After the researchers' experiments, the phase shifting unit 211' with different angles has different effects. For example, the insertion loss of the phase shifting unit 211' with 45 degrees is reduced by 1.5 dB. Further, the reduction amount of insertion loss is also related to the width of the transistor.

Figure 17:
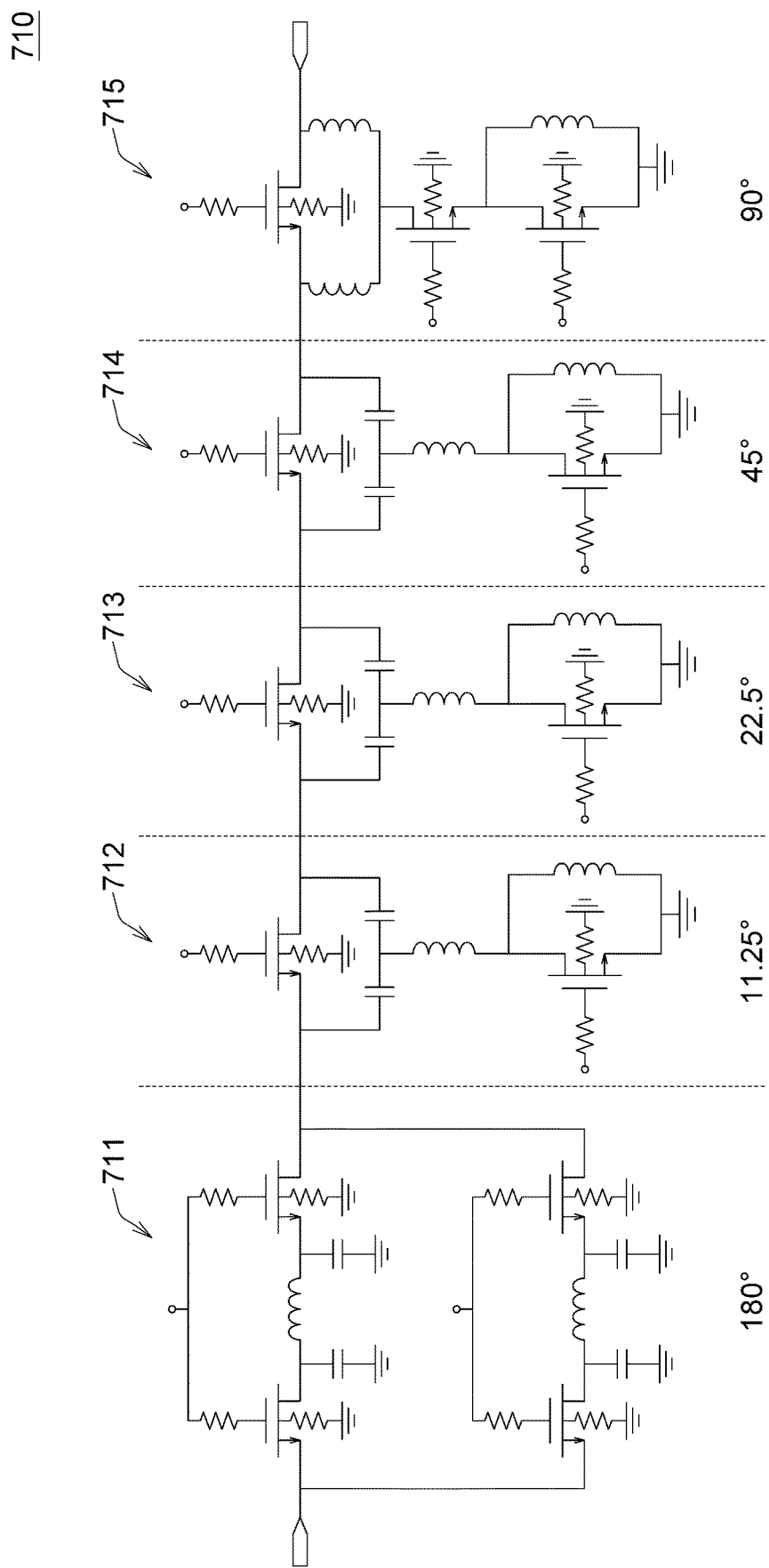
FIG. 17 shows a phase shifter according to one embodiment.

The phase shifting units 211, 211' proposed above can be combined into a multi-bit phase shifter. Or, the phase shifting units 211, 211' proposed above may also be combined with other kinds of phase shifting units into a multi-bit phase shifter. Please refer to FIG. 17, which shows a phase shifter 710 according to one embodiment. The phase shifter 710 includes a phase shifting unit 711 with 180 degrees, a phase shifting unit 712 with 11.25 degrees, a phase shifting unit 713 with 22.5 degrees, a phase shifting unit 714 with 45 degrees and a phase shifting unit 715 with 90 degrees. The phase shifting unit 712 with 11.25 degrees, the phase shifting unit 713 with 22.5 degrees and the phase shifting unit 714 with 45 degrees may, for example, adopts the design of the phase shifting unit 211' FIG. 15.

Figure 18:
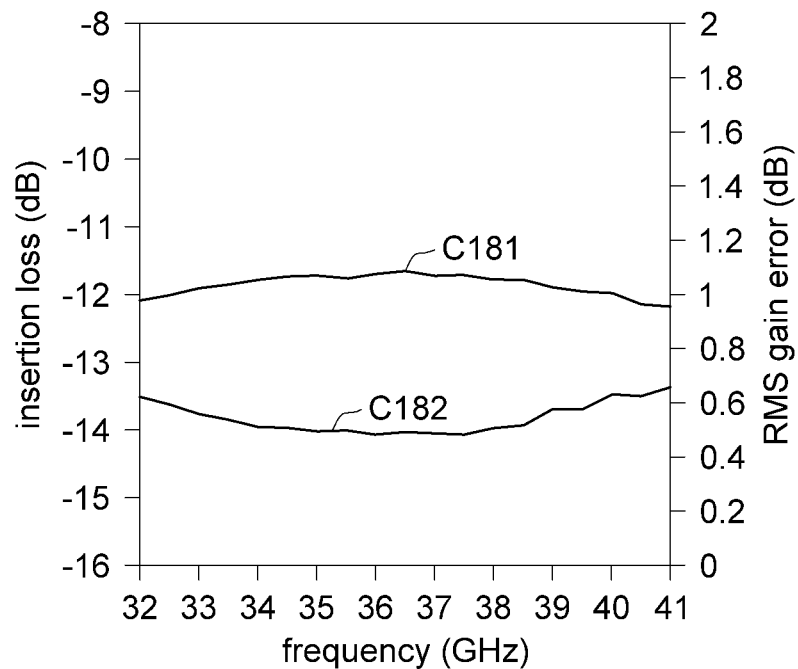
FIG. 18 shows an example of average insertion loss curve and a RMS gain error curve of the phase shifter.

Please refer to FIG. 18, which shows an example of average insertion loss curve C181 and a RMS gain error curve C182 of the phase shifter 710. The 5 bits phase shifter 710 has 32 combined statuses, so 32 sets of insertion loss are measured. The average insertion loss curve C181 is the average of 32 sets of insertion loss. According to the 32 sets of insertion loss and the average insertion loss curve C181, the RMS gain error curve C182 of the phase shifter 710 can be obtained. As shown in FIG. 18, the RMS gain error curve C182 can be maintained at a low value over a wide frequency range, so the phase shifter 710 can be used in a broadband.

Figure 19:
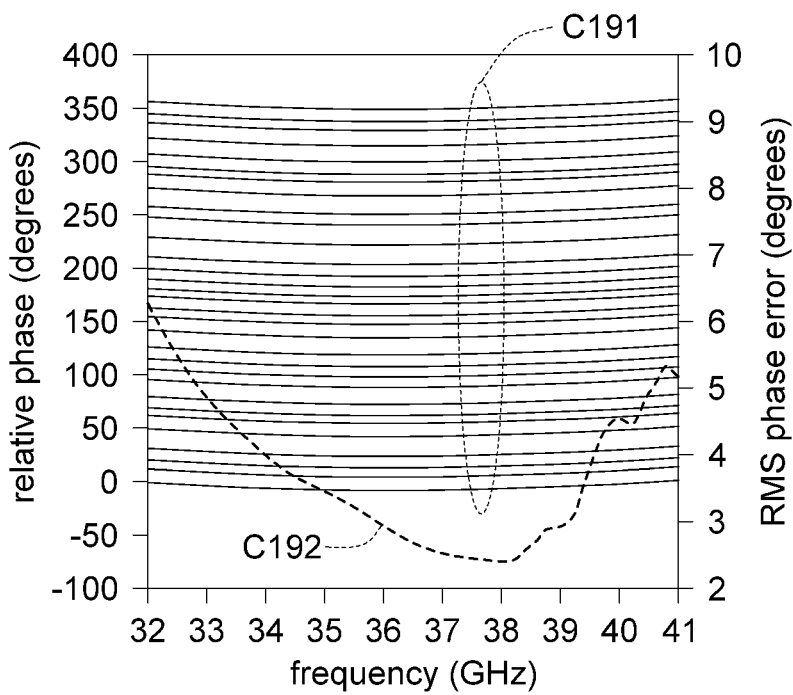
FIG. 19 shows an example of relative phase curves and a RMS phase error curve of the phase shifter.

Please refer to FIG. 19, which shows an example of relative phase curves C191 and a RMS phase error curve C192 of the phase shifter 710. The 5 bits phase shifter 710 has 32 combined statuses, so 32 relative phase curves C191 can be measured. According to the relative phase curves C191, the RMS phase error curve C192 can be obtained. As shown in FIG. 19, the value of the RMS phase error curve C192 of the phase shifter 710 is relatively low, so the phase shifter 710 can be used in a broadband.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A phase shifter, comprising at least one phase shifting unit, wherein the phase shifting unit includes:
    a first switch, having a first end, a second end, a third end and a fourth end;
    a first capacitor;
    a second capacitor;
    a first inductor, wherein the first capacitor is connected between the first inductor and the second end of the first switch, the second capacitor is connected between the first inductor and the third end of the first switch;
    a second switch, having a first end, a second end, a third end and a fourth end, wherein the second end of the second switch is connected to a ground end;
    a second inductor, wherein two ends of the second inductor are respectively connected to the ground end and the third end of the second switch, and the first inductor is connected between the first capacitor and the third end of the second switch;
    a first resistor, connected between the first end of the first switch and a first control voltage;
    a second resistor, connected between the first end of the second switch and a second control voltage, wherein the first control voltage is a reverse voltage of the second control voltage;
    a third resistor, connected to the fourth end of the first switch; and
    a fourth resistor, connected to the fourth end of the second switch.

2. The phase shifter according to claim 1, wherein the first switch is a field effect transistor, and the second switch is a field effect transistor.

3. The phase shifter according to claim 2, wherein the third resistor is connected between the fourth end of the first switch and the ground end, and the fourth resistor is connected between the fourth end of the second switch and the ground end.

4. The phase shifter according to claim 2, wherein the fourth end of the first switch is a body, and the fourth end of the second switch is a body.

5. The phase shifter according to claim 1, wherein the first end of the first switch is a gate, one of the second end and the third end of the first switch is a source, another one of the second end and the third end of the first switch is a drain, the first end of the second switch is a gate, one of the second end and the third end of the second switch is a source, and another one of the second end and the third end of the second switch is a drain.

6. A phase array module, comprising:
    a power divider;
    an adjustable attenuator array, connected to the power divider;
    a phase array, connected to the adjustable attenuator array, wherein the phase array includes a plurality of phase shifters, one of the phase shifters includes at least one phase shifting unit, and the phase shifting unit includes:
        a first switch, having a first end, a second end, a third end and a fourth end;
        a first capacitor;
        a second capacitor;
        a first inductor, wherein the first capacitor is connected between the first inductor and the second end of the first switch, the second capacitor is connected between the first inductor and the third end of the first switch;

a second switch, having a first end, a second end, a third end and a fourth end, wherein the second end of the second switch is connected to a ground end;

a second inductor, wherein two ends of the second inductor are respectively connected to the ground end and the third end of the second switch, and the first inductor is connected between the first capacitor and the third end of the second switch;

a first resistor, connected between the first end of the first switch and a first control voltage;

a second resistor, connected between the first end of the second switch and a second control voltage, wherein the first control voltage is a reverse voltage of the second control voltage;

a third resistor, connected to the fourth end of the first switch; and a fourth resistor, connected to the fourth end of the second switch;

a first switch array, connected to the phase array;

a power amplifier array, connected to the first switch array;

a low noise amplifier array, connected to the first switch array; and a second switch array, connected to the power amplifier array and the low noise amplifier array.

7. The phase array module according to claim 6, wherein the first switch is a field effect transistor, the second switch is a field effect transistor.

8. The phase array module according to claim 7, wherein the third resistor is connected between the fourth end of the first switch and the ground end, and the fourth resistor is connected between the fourth end of the second switch and the ground end.

9. The phase array module according to claim 7, wherein the fourth end of the first switch is a body, and the fourth end of the second switch is a body.

10. The phase array module according to claim 6, wherein the first end of the first switch is a gate, one of the second end and the third end of the first switch is a source, another one of the second end and the third end of the first switch is a drain, the first end of the second switch is a gate, one of the second end and the third end of the second switch is a source, and another one of the second end and the third end of the second switch is a drain.

* * * * *